United States Patent
Vaithyanathan et al.

(10) Patent No.: US 8,421,048 B2
(45) Date of Patent: Apr. 16, 2013

(54) NON-VOLATILE MEMORY WITH ACTIVE IONIC INTERFACE REGION

(75) Inventors: Venugopalan Vaithyanathan, Bloomington, MN (US); Markus Jan Peter Siegert, Minneapolis, MN (US); Wei Tian, Bloomington, MN (US); Muralikrishnan Balakrishnan, Eden Prairie, MN (US); Insik Jin, Eagan, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 946 days.

(21) Appl. No.: 12/501,689

(22) Filed: Jul. 13, 2009

(65) Prior Publication Data

US 2011/0007544 A1    Jan. 13, 2011

(51) Int. Cl.
*H01L 29/02* (2006.01)
*H01L 45/00* (2006.01)

(52) U.S. Cl.
USPC .............. 257/2; 257/4; 257/30; 257/E29.002; 257/E45.003

(58) Field of Classification Search .................. 365/148, 365/151, 163; 257/2, 4, 30, E29.002, E45.003
See application file for complete search history.

(56) References Cited

U.S. PATENT DOCUMENTS

| 6,204,139 B1 | 3/2001 | Liu et al. |
| 2006/0050598 A1 | 3/2006 | Rinerson et al. |
| 2006/0171200 A1 | 8/2006 | Rinerson et al. |

FOREIGN PATENT DOCUMENTS

WO    2006/029228 A2    3/2006

*Primary Examiner* — Allison P Bernstein
(74) *Attorney, Agent, or Firm* — Hall Estill Attorneys at Law (57) ABSTRACT

An example memory cell may have at least a tunneling region disposed between a conducting region and a metal region, wherein the tunneling region can have at least an active interface regio disposed between a first tunneling barrier and a second tunneling barrier. A high resistive film is formed in the interface region with migration of ions from both the metal and conducting regions responsive to a write current to program the memory cell to a selected resistive state.

20 Claims, 5 Drawing Sheets

NON-VOLATILE MEMORY WITH ACTIVE IONIC INTERFACE REGION

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In these and other types of data storage devices, it is often desirable to increase efficiency of memory cell formation, particularly with regard to the reading of data from the memory cell.

SUMMARY

Various embodiments of the present invention are generally directed to a non-volatile memory cell and method of use therefor, such as but not limited to a memory cell having a programmable metallization cell (PMC) construction.

In accordance with some embodiments, the memory cell comprises a tunneling region disposed between a conducting region and a metal region, wherein the tunneling region comprises an active interface region disposed between a first tunneling barrier and a second tunneling barrier. A high resistive film is formed in the active interface region with migration of ions from both the metal and conducting regions responsive to a write current to program the memory cell to a selected resistive state.

In accordance with other embodiments, the method comprises providing a non-volatile memory cell comprising a tunneling region disposed between an conductive region and a metal region, wherein the tunneling region comprises an active interface region disposed between a first tunneling barrier and a second tunneling barrier, and forming a high resistive film in the active interface region with migration of ions from both the metal and conductive regions by application of a write current to program the memory cell to a selected resistive state.

These and other features and advantages which characterize the various embodiments of the present invention can be understood in view of the following detailed discussion and the accompanying drawings.

DETAILED DESCRIPTION

Figure 1:
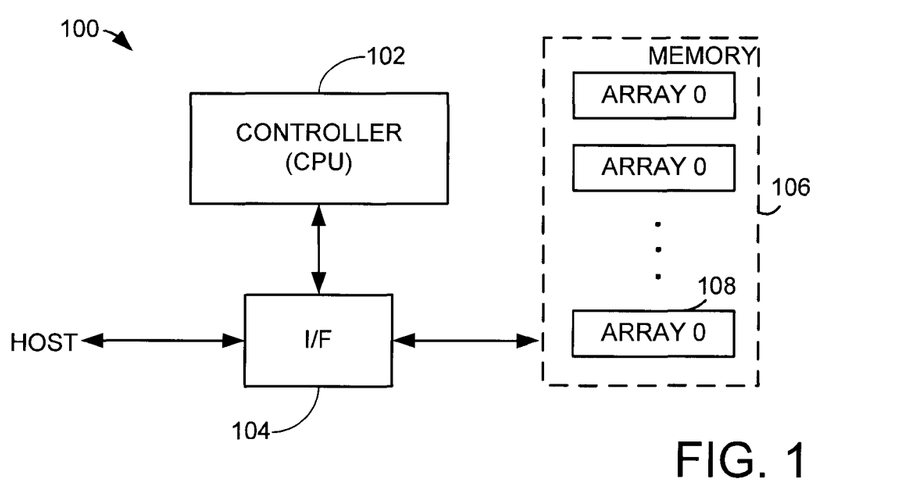
FIG. 1 is a generalized functional representation of an exemplary data storage device constructed and operated in accordance with various embodiments of the present invention.

FIG. 1 provides a functional block representation of a data storage device 100 constructed and operated in accordance with various embodiments of the present invention. The data storage device is contemplated as comprising a portable non-volatile memory storage device such as a PCMCIA card or USB-style external memory device. It will be appreciated, however, that such characterization of the device 100 is merely for purposes of illustrating a particular embodiment and is not limiting to the claimed subject matter.

Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of memory arrays 108 (denoted Array 0-N), although it will be appreciated that a single array can be utilized as desired. Each array 108 comprises a block of semiconductor memory of selected storage capacity. Communications between the controller 102 and the memory space 106 are coordinated via the I/F 104.

While not limiting, any number of data storage and transfer protocols can be utilized, such as logical block addressing (LBAs) whereby data are arranged and stored in fixed-size blocks (such as 512 bytes of user data plus overhead bytes for ECC, sparing, header information, etc). Host commands can be issued in terms of LBAs, and the device 100 can carry out a corresponding LBA-to-PBA (physical block address) conversion to identify and service the associated locations at which the data are to be stored or retrieved.

Figure 2:
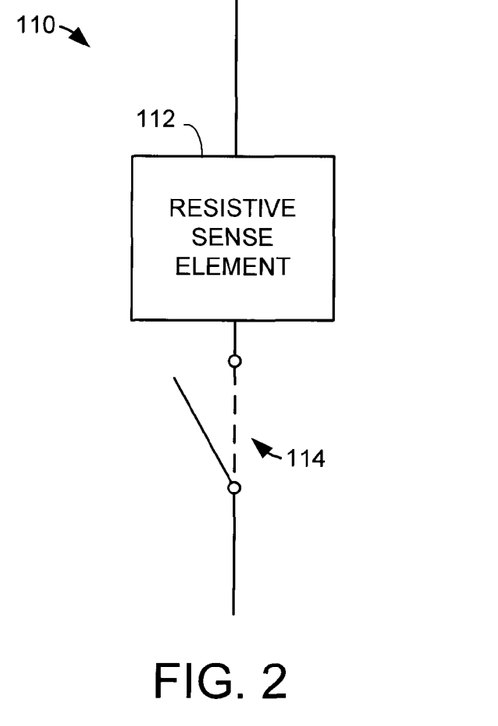
FIG. 2 displays an exemplary memory cell capable of being used in the memory array of FIG. 1.

FIG. 2 displays functional block representations of a memory cell 110 constructed and operated in accordance with various embodiments of the present invention. The unit cell 110 has a resistive sense element (RSE) 112 connected in series with a switching device 114. The switching device 114 functions to drastically increase the resistance of the unit cell 110 when in an open position, as shown, that effectively prevents current from passing. In contrast, a closed position allows the switching device 114 to receive current and pass it through the unit cell 110. A closed switching device 114 also allows current to pass through the RSE 112 in multiple directions.

Advantages of RSE cells over other types of non-volatile memory cells such as EEPROM and flash include the fact that no floating gate is provided in the cell construction. No erase operation is necessary prior to the writing of new data to an existing set of cells. Rather, RSE cells can be individually accessed and written to any desired logical state (e.g., a "0" or "1") irrespective of the existing state of the RSE cell. Also, write and read power consumption requirements are substantially reduced, significantly faster write and read times can be achieved, and substantially no wear degradation is observed as compared to erasable cells, which have a limited write/erase cycle life.

However, a construction of a resistive sense element 112 can have disadvantages, such as non-complete programming. For example, a formation of a film can be used to program an RSE 112, but over time a residual amount of film can remain after a programming cycle and eventually become permanently ingrained. Hence, increased programming current and errors in logical state determination can result from such lack of completely reversible resistance state programming.

Accordingly, various embodiments are generally directed to an improved memory cell configuration that overcomes these and other limitations of the prior art. As explained below, a memory cell is provided with an active interface region configured to provide completely reversible programming by forming a high resistive film with the migration of ions from a metal region and a conductive region. The formation of a film can be isolated to a predetermined location that allows complete and repeatable setting and resetting of the respective programmed states of the cell. As such, large amounts of data can be repeatably written to the cell without long term degradations in performance.

Figure 3:
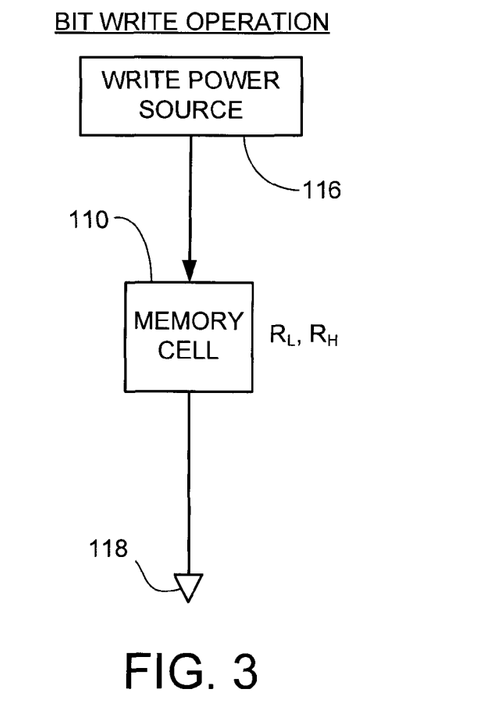
FIG. 3 generally illustrates a manner in which data can be written to a memory cell of the memory array.

With regard to FIG. 3, data can be written to the respective memory cells 110 as generally depicted. Often, a write power source 116 applies the necessary input (such as in the form of current, voltage, magnetization, etc.) to configure the memory cell 110 to a desired state. It can be appreciated that FIG. 3 is merely a representative illustration of a bit write operation. The configuration of the write power source 116, memory cell 110, and reference node 118 can be suitably manipulated to allow writing of a selected logic state to each cell.

As explained below, in some embodiments the memory cell 110 takes a modified RRAM configuration, in which case the write power source 116 is characterized as a current driver connected through a memory cell 110 to a suitable reference node 118, such as ground. The write power source 116 provides a stream of power by moving through a material in the memory cell 110.

The cell 110 may take either a relatively low resistance ($R_L$) or a relatively high resistance ($R_H$). While not limiting, exemplary $R_L$ values may be in the range of about 1000 ohms ($\Omega$) or so, whereas exemplary $R_H$ values may be in the range of about 2000$\Omega$ or so. Other resistive memory type configurations (e.g., RRAMS) are supplied with a suitable voltage or other input, but provide a much broader range of resistance values ($R_L \sim 100\Omega$ and $R_H \sim 10$ M $\Omega$). These values are retained by the respective cells until such time that the state is changed by a subsequent write operation. While not limiting, in the present example it is contemplated that a high resistance value ($R_H$) denotes storage of a logical 1 by the cell 124, and a low resistance value ($R_L$) denotes storage of a logical 0.

Figure 4:
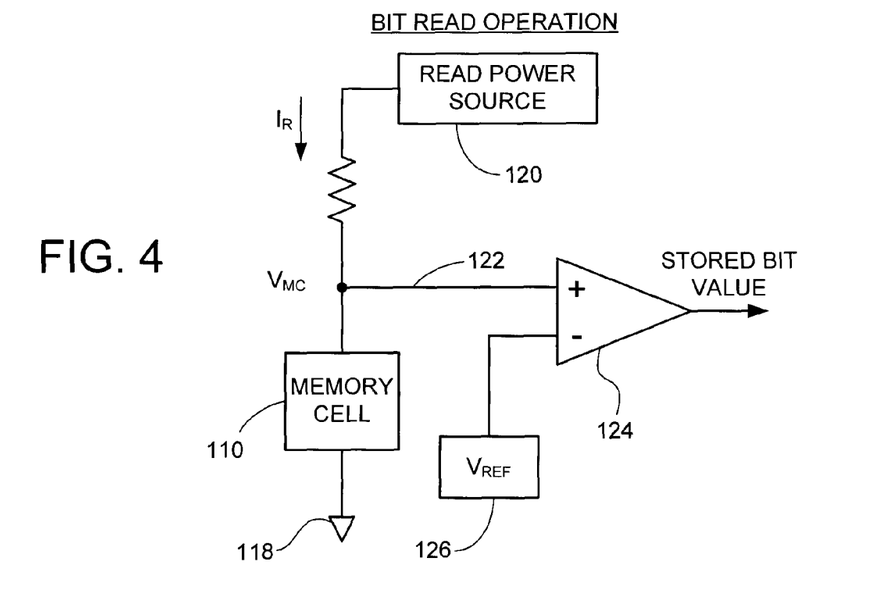
FIG. 4 generally illustrates a manner in which data can be read from the memory cell of FIG. 3.

The logical bit value(s) stored by each cell 110 can be determined in a manner such as illustrated by FIG. 4. A read power source 120 applies an appropriate input (e.g., a selected read voltage) to the memory cell 110. The amount of read current $I_R$ that flows through the cell 110 will be a function of the resistance of the cell ($R_L$ or $R_H$, respectively). The voltage drop across the memory cell (voltage $V_{MC}$) is sensed via path 122 by the positive (+) input of a comparator 124. A suitable reference (such as voltage reference $V_{REF}$) is supplied to the negative (−) input of the comparator 124 from a reference source 126.

The voltage reference $V_{REF}$ can be selected from various embodiments such that the voltage drop $V_{MC}$ across the memory cell 110 will be lower than the $V_{REF}$ value when the resistance of the cell is set to $R_L$, and will be higher than the $V_{REF}$ value when the resistance of the cell is set to $R_H$. In this way, the output voltage level of the comparator 124 will indicate the logical bit value (0 or 1) stored by the memory cell 110.

Figure 5:
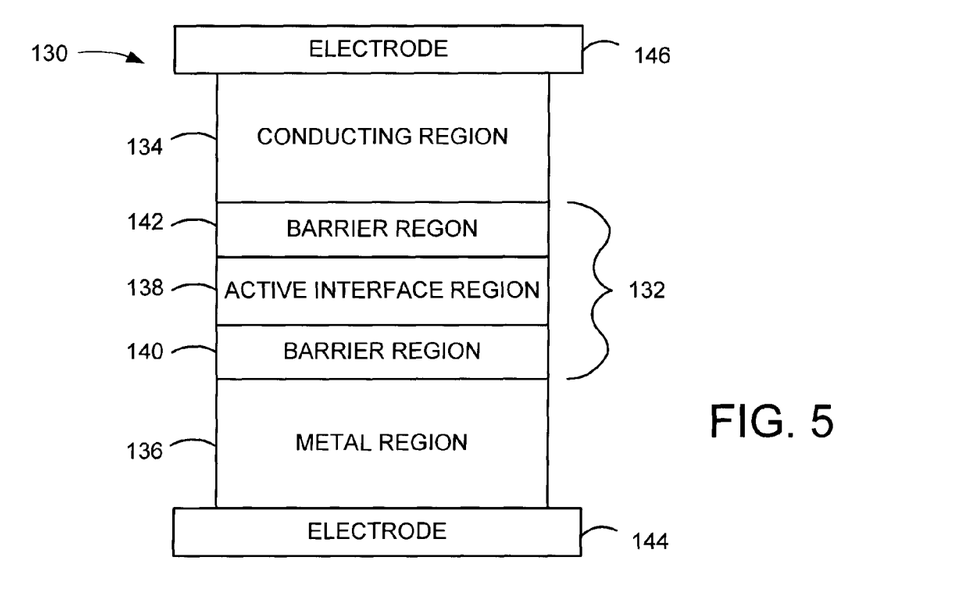
FIG. 5 shows an exemplary resistive sense element constructed in accordance with various embodiments of the present invention.

FIG. 5 illustrates an exemplary resistive sense element 130 constructed in accordance with various embodiments of the present invention. The resistive sense element 130 can include a tunneling region 132 disposed between a conducting region 134 and a metal region 136. In some embodiments, the tunneling region 132 has an active interface region 138 disposed between a first tunneling barrier 140 and a second tunneling barrier 142. Furthermore, a first electrode 144 is coupled to the metal region 136 and a second electrode 146 is coupled to the conducting region 134.

It should be noted that the orientation of the various components of the resistive sense element 130 is not limited. For example, the conducting region 134 can be positioned adjacent the first electrode and the first tunneling barrier. Similarly, the formation of the resistive sense element 130 is not restricted as the various components can be a number of different materials and physical configurations, as desired. In another example, the active interface region 138 is isolated to the interface of the first and second tunneling barriers 140 and 142. Such a configuration can naturally form the active interface region in which a high resistive film can be isolated.

In various embodiments of the present invention, the tunneling region 132 comprises a programmable metallization cell (PMC) that is constructed with a metal-ion solid electrolyte for the first tunneling barrier and an oxygen-ion solid electrolyte for the second tunneling barrier. It can be appreciated that a variety of materials can be constructed as the solid electrolyte material including, but not limited to, yuria-stabilized-zirconia (YSZ), titanium oxide ($TiO_2$), silicon oxide ($SiO_2$), tungsten oxide ($WO_3$), various metal sulphides, and various metal tellurides. Similarly, the active interface region can also be constructed with various solid materials that have electrolytic characteristics, either inherently or as a result of a doping process.

In addition, one possible configuration of the conducting region 134 is as a composite of praseodymium (Pr), calcium (Ca), manganese (Mn), and oxygen (O) otherwise known by one skilled in the art as a PCMO. A conductive composite PCMO can be utilized to provide oxygen ions to the active interface region 138. In contrast, the metal region 136 can comprise any number of metals such as, but not limited to, alkaline Earth metals and refractory metals.

Figure 6:
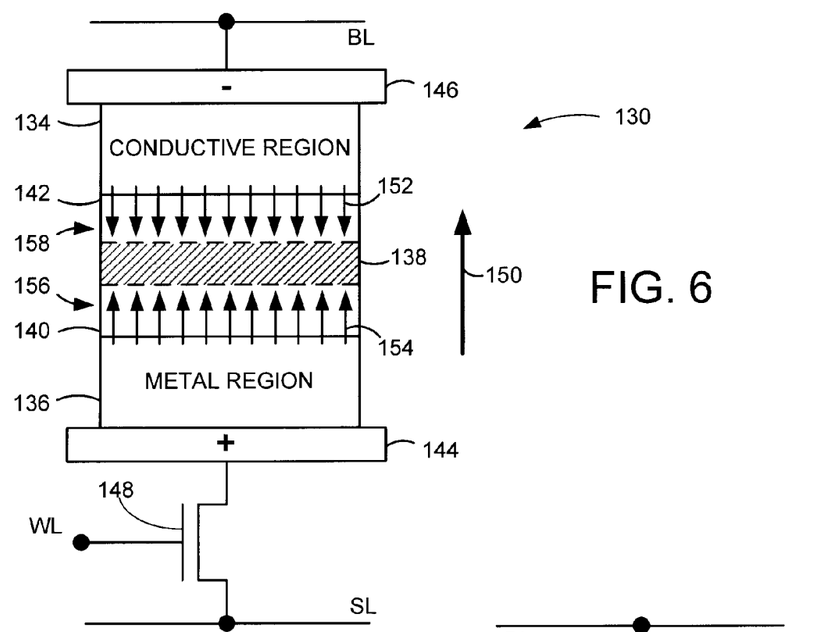
FIG. 6 displays an exemplary operation of the resistive sense element of FIG. 5.
Figure 7:
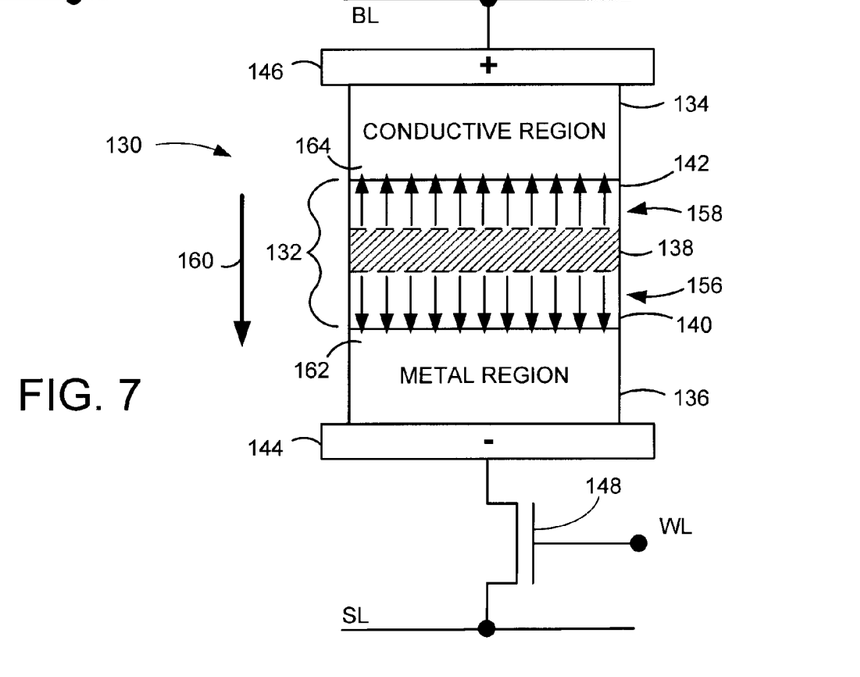
FIG. 7 shows an exemplary operation of the resistive sense element of FIG. 5.

In FIGS. 6 and 7, exemplary operations of the resistive sense element 130 of FIG. 5 are displayed. The resistive sense element 130 is shown configured in a memory cell orientation, such as the memory cell 110 of FIG. 2, and connected in series with a switching device 148. As the switching device 148 is activated, a write current 150 can flow from the source line (SL) through the resistive sense element 130 to the bit line (BL). In various embodiments of the present invention, the presence of the write current 150 passing through the resistive sense element 130 in a first direction corresponds to the migration of ions 152 and 154 from both the conducting region 134 and metal region 136 to the active interface region 138.

Further in some embodiments, only oxygen ions 152 from the conducting region 134 migrate through the second tunneling barrier and only metal ions 154 from the metal region 136 migrate through the first tunneling barrier 140. While the ion migration from the metal region 136 and conducting region 134 can occur simultaneously, such concurrent migration is not required by the present invention. As a result of the migration of dissimilar ions to the active interface region 138, a high resistive film can form in resistive regions 156 and 158 of the first and second tunneling barriers 140 and 142.

It should be noted that the high resistive film could form in a variety of manners. That is, the film can form as a single continuous layer fully separating one, or both, tunneling barrier(s) from the active interface region 138 or the film could form as one or many independent non-continuous islands in the resistive regions 156 and 158. Regardless, the presence of a predetermined amount of high resistive film in the resistive regions 156 and 158 can switch the overall resistance of the resistive sense element 130 from a low resistance state to a high resistive state.

Conversely, any high resistive film is dissolved when a write current 160 passes through the resistive sense element 130 in a second direction that opposes the first write current direction, as shown in FIG. 7. The flow of the write current 160, in some embodiments, electromechanically forces separation of the metal ions 162 and oxygen ions 164 present in the resistive regions 156 and 158 as well as in the active interface region 138. Such separation can be characterized as a migration of ions through the first and second tunneling barriers 140 and 142 to the respective conductive and metal regions 134 and 136. That is, the flow of write current 160 in the second direction through the resistive sense element 130 induces the ions present in the tunneling region 132 to migrate to their respective ion sources, the conductive region 134 and metal region 136.

For example, an oxygen ion that is produced and migrates from the conductive region 134 to the active interface region 138 during the flow of write current 150, shown in FIG. 6, is induced to return to the conducting region 134 by the flow of write current 160 displayed in FIG. 7. While varying amounts of ionic migration can be achieved with various write current pulse duration and strength, the write current 160 can force the complete migration of all metal and oxygen ion 162 and 164 from the tunneling region 132. As such, the write current 160 can be set to repeatedly program the resistive sense element 130 to a low resistive state without residual high resistive film remaining in the tunneling region 132 and potentially inducing errors when reading a logical state.

To clarify, the ionic migration of metal ions and oxygen ions induced by the write current 150 can be completely reversed by the write current 160. However, the particular directions of the write currents are not limiting as the write current 150 could flow from bit line to source line while write current 160 flows from source line to bit line. Further, it can be appreciated that a redox reaction can induced by the write current 160 to allow the complete reverse migration of ions from the tunneling region 132 and the dissolution of any high resistive film.

Thus, a high resistive film can be formed through the combination of dissimilar ions from dissimilar sources in the active interface region. Such combination can form a high resistive film such as metal oxide in one, or both, of the resistive regions 156 and 158 simultaneously or successively. It should be noted that the high resistive film is stable and does not require continual power or refreshing to exist. Therefore, it can be appreciated that such non-volatile characteristics and programmability can be translated into logical states and functioning memory cells by a variety of electrical circuitry, such as the circuits shown in FIGS. 3 and 4.

Further in an exemplary operation of the resistive sense element 130, the tunneling barrier disposed between the conductive region 134 and the active interface region 138 will experience only oxygen-ion migration while the tunneling barrier disposed between the metal region 136 and the active interface region 138 will experience only metal-ion migration. In other embodiments, a positive bias can be applied to an electrode 180 or 182 to induce migration of the ions, as shown in FIGS. 6 and 7. Upon migration of ions from the conductive and metal regions 134 and 136, respectively, a high resistive film can form in one, or both resistive regions 156 and 158 depending on the diffusion of ions through the tunneling barriers.

Figure 8:
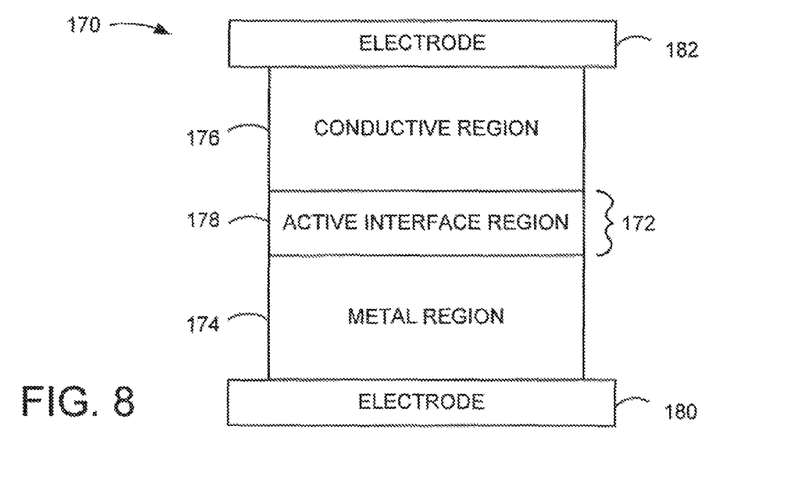
FIG. 8 illustrates an exemplary resistive sense element constructed in accordance with various embodiments of the present invention.
Figure 9:
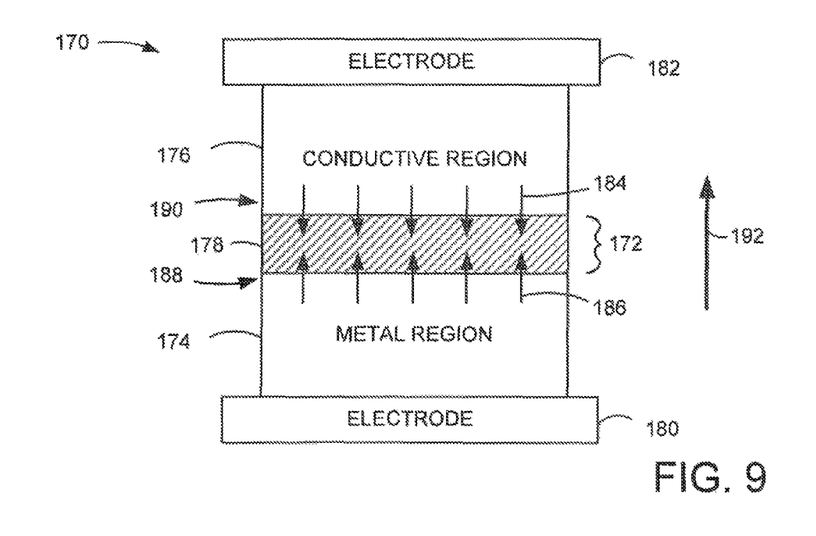
FIG. 9 shows an exemplary operation of the resistive sense element of FIG. 7.

FIGS. 8 and 9 generally illustrate a resistive sense element 170 constructed and operated in accordance with various embodiments of the present invention. The resistive sense element 170 can include a tunneling region 172 disposed between a metal region 174 and a conductive region 176. While the resistive sense element 170 can be configured with dissimilar first and second tunneling barriers in the tunneling region 172, such as resistive sense element 130 of FIGS. 5-7, the first and second tunneling barriers can comprise the same material as the active interface region 178. Thus, a single active interface region 178 can define the entirety of the tunneling region 172.

Furthermore, a first electrode 180 can be coupled to the metal region 174 while a second electrode 182 is connected adjacent to the conductive region 176. However, such orientation and configuration is not limiting as the electrodes can be a variety of different materials and connected to various portions of the resistive sense element 170, as desired. For example, the first electrode 180 could be a first material and connected adjacent to the conductive region 176 while the second electrode 183 is a second material and coupled adjacent to the metal region 174.

The operation of the resistive sense element 170 can imitate the resistive sense element 130 of FIGS. 5-7 in many aspects such as non-volatility and programmability. However, a high resistive film will form outside of the tunneling region 172 in the resistive sense element 170. That is, ions from the conductive region 176 and metal region 174 will migrate in opposing directions and interact in the active interface region 178, but form a high resistive film, such as a metal oxide, in resistive regions 188 and 190 which are located outside of the tunneling region 172.

It can be appreciated that many operational similarities can exist between the resistive sense elements 130 and 170. As shown in FIG. 9, the presence of a write current 192 can induce the migration metal ions 186 from the metal region 174 to the active interface region 178. Such migration can form one, or many, high resistive films capable of changing the overall resistance of the resistive sense element 170 to a high resistive state. In addition, a write current with a direction opposing that of write current 192 can force the complete dissolution of any high resistive film and migration of metal and oxygen ions 186 and 184 away from the resistive regions 188 and 190.

It can further be appreciated that the resistive sense element 170 can be comprised of numerous different materials such as, but not limited to, PCMO, solid electrolytes, and refractory metals similar to that of resistive sense element 130. Further, the orientation of the various components of the resistive sense element 170 are not restricted by the configuration shown in FIGS. 8-9 and can be modified, as desired, to form a high resistive film and program various resistive states.

Figure 10:
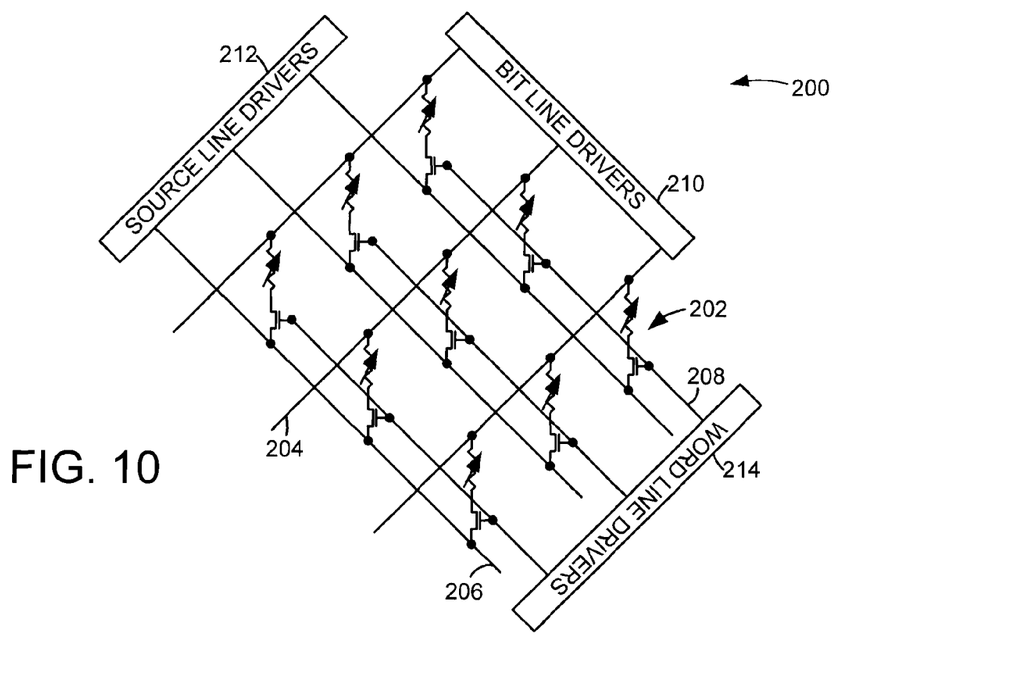
FIG. 10 displays an array of memory cells operated in accordance with various embodiments of the present invention.

One of the various operational functions of the resistive sense elements 130 and 170 is in an array of memory cells 200, generally illustrated in FIG. 10. As shown, a plurality of memory cells 202 can be arranged in rows and columns and connected between a bit line 204 and a source line 206. In addition, each memory cell 202 can be selectively activated through a word line 208. Operation of the array is carried out, in some embodiments, by the configuration of bit line drivers 210 and source line drivers 212 and the activation of a predetermined number of memory cells 202 by word line drivers 214.

It can be appreciated that a number of various configurations of line drivers are possible for the array 200. That is, a line driver can be utilized for each bit line 204, source line 206, and word line 208 just as a single line driver could be used to operate all the bit lines, source lines, and word lines. Furthermore, one skilled in the art can appreciate that the orientation of the bit line 204, source line 206, and word line 208 is not limited. For example, the source line 206 and bit line 204 can be configured to have an orthogonal relationship to one another while the word line 208 is positioned parallel to the bit line 204.

Figure 11:
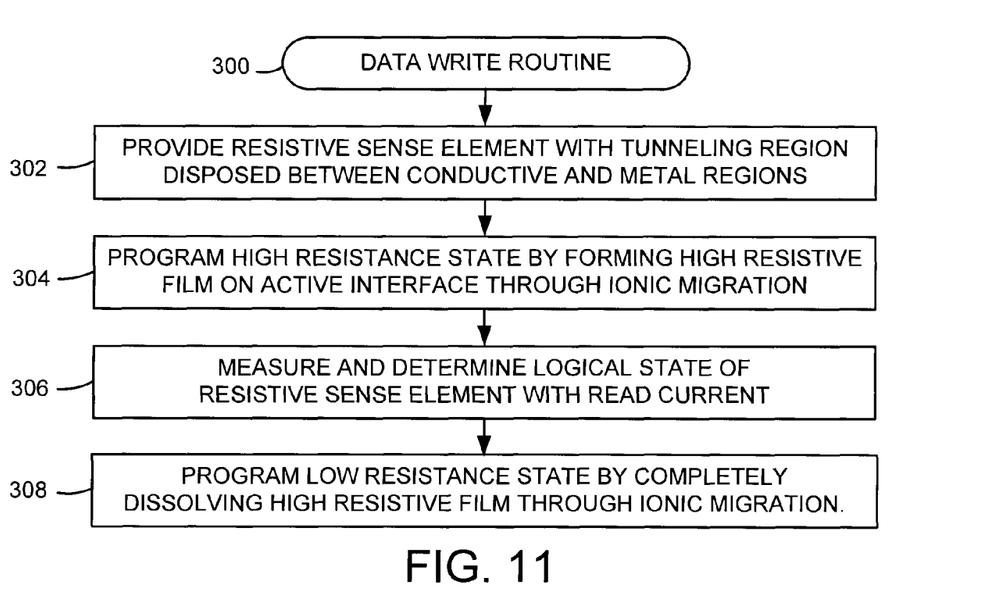
FIG. 11 provides a flowchart of an exemplary data write routine carried out in accordance with various embodiments of the present invention.

FIG. 11 provides a flowchart of an exemplary data write routine 300 carried out in accordance with various embodiments of the present invention. Initially, a non-volatile resistive sense element having a tunneling region disposed between a conductive region and metal region is provided in step 302. In some embodiments, the tunneling region is configured with an active interface region being disposed between a first tunneling barrier and a second tunneling barrier. Step 304 involves forming a high resistive film on the active interface region through the migration of ions from both the metal region and the conductive region.

With the formation of a high resistive film at step 304, the resistance state and corresponding logical state of the resistive sense element can change from low resistance to high resistance. Such a logical state is measured and determined in step 306 with a read current that has a magnitude less than that of the write current. It is anticipated that a write current having a first direction of flow through the resistive sense element is used to induce migration of ions and formation of the high resistive film.

Conversely in step 308, a write current having a second direction of flow is used to dissolve the high resistive film and force complete ionic migration from the tunneling region to the respective metal and conductive regions. As a result, the resistive sense element returns to an initial configuration that corresponds to a low resistance.

As can be appreciated by one skilled in the art, the various embodiments illustrated herein provide advantages in both memory cell efficiency and complexity due to the completely reversible formation of a high resistive film through ionic migration. The regulation of the migration of ions from the metal region and conductive region through tunneling barriers further provides heightened performance by effectively eliminating inadvertent programming of memory cells. Moreover, manufacturing accuracy can be greatly improved by reducing the complexity associated with various manufacturing methods, such as magnetism tolerance. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A non-volatile memory cell comprising a tunneling region disposed between a conducting region and a metal region, wherein the tunneling region comprises an active interface region separated from the conducting and metal regions by being disposed between a first tunneling barrier and a second tunneling barrier, and wherein a high resistive film is formed in the active interface region with migration of ions from both the metal and conducting regions responsive to application of a write current to program the memory cell to a selected resistive state.

2. The memory cell of claim 1, wherein only metal ions pass through the first tunneling barrier and only oxygen ions pass through the second tunneling barrier.

3. The memory cell of claim 1, wherein a plurality of metal ions passes through the first tunneling barrier and a plurality of oxygen ions passes through the second tunneling barrier simultaneously in opposing directions.

4. The memory cell of claim 1, wherein the high resistive film comprises a metal oxide that forms adjacent the active interface region and in the first and second tunneling barriers.

5. The memory cell of claim 1, wherein the tunneling region comprises a programmable metallization cell (PMC) where the first tunneling barrier comprises a metal-ion conducting solid electrolyte material and the second tunneling barrier comprises an oxygen-ion conducting solid electrolyte material.

6. The memory cell of claim 1, wherein the conducting region comprises a PMCO conductive material.

7. The memory cell of claim 1, wherein the high resistive film forms a plurality of independent islands on the active interface region.

8. The memory cell of claim 1, wherein the first and second tunneling barriers comprise the same material as the active interface region.

9. The memory cell of claim 1, wherein the high resistive film is formed by passing a first current with a first direction through the tunneling region and the high resistive film is completely dissipated by passing a second current with a second direction through the tunneling region.

10. A method comprising providing a non-volatile memory cell comprising a tunneling region disposed between a conductive region and a metal region, wherein the tunneling region comprises an active interface region separated from the conducting and metal regions by being disposed between a first tunneling barrier and a second tunneling barrier, and forming a high resistive film in the active interface region with migration of ions from both the metal and conductive regions by applying a write current to program the memory cell to a selected resistive state.

11. The method of claim 10, wherein only metal ions pass through the first tunneling barrier and only oxygen ions pass through the second tunneling barrier.

12. The method of claim 10, wherein a plurality of metal ions passes through the first tunneling barrier and a plurality of oxygen ions passes through the second tunneling barrier simultaneously in opposing directions.

13. The method of claim 10, wherein the high resistive film comprises a metal oxide that forms adjacent the active interface region and in the first and second tunneling barriers.

14. The method of claim 10, wherein the tunneling region comprises a programmable metallization cell (PMC) where the first tunneling barrier comprises a metal-ion conducting solid electrolyte material and the second tunneling barrier comprises an oxygen-ion conducting solid electrolyte material.

15. The method of claim 10, wherein the conductive region comprises a PMCO conductive material.

16. The method of claim 10, wherein the high resistive film forms a plurality of independent islands on the active interface region.

17. The method of claim 10, wherein the first and second tunneling barriers comprise the same material as the active interface region.

18. The method of claim 10, wherein the metal region comprises an Earth metal material.

19. The method of claim 10, wherein the high resistive film is formed by passing a first current with a first direction through the tunneling region and the high resistive film is completely dissipated by passing a second current with a second direction through the tunneling region.

20. An apparatus comprising an active interface region separated from a conducting region and a metal region respectively by first and second tunneling barrier regions, the active interface region configured to form a high resistive film separated from the conducting and metal regions with migration of ions from both the conducting and metal regions responsive to application of a write current to program a selected resistive state.

* * * * *

UNITED STATES PATENT AND TRADEMARK OFFICE
CERTIFICATE OF CORRECTION

PATENT NO. : 8,421,048 B2
APPLICATION NO. : 12/501689
DATED : April 16, 2013
INVENTOR(S) : Venugopalan Vaithyanathan et al.

Page 1 of 1

It is certified that error appears in the above-identified patent and that said Letters Patent is hereby corrected as shown below:

On the Title page, Item (57)
In line 4 of the Abstract,
replace "regio"
with "region."

Signed and Sealed this
Sixteenth Day of July, 2013

Teresa Stanek Rea
*Acting Director of the United States Patent and Trademark Office*